United States Patent
Ichihara et al.

[11] Patent Number: 6,033,536
[45] Date of Patent: *Mar. 7, 2000

[54] MAGNETRON SPUTTERING METHOD AND SPUTTERING TARGET

[75] Inventors: Katsutaro Ichihara, Yokohama; Kohichi Tateyama, Ichikawa; Ryo Sakai; Takashi Ishigami, both of Yokohama, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/612,575

[22] Filed: Mar. 8, 1996

[30] Foreign Application Priority Data

Mar. 10, 1995 [JP] Japan ................................ 7-051285
Jan. 25, 1996 [JP] Japan ................................ 8-011031

[51] Int. Cl.$^7$ .................................................. C23C 14/34
[52] U.S. Cl. ............................ 204/192.2; 204/192.15; 204/298.12; 204/298.13; 204/298.19
[58] Field of Search ........................ 204/192.15, 192.2, 204/298.12, 298.13, 298.19

[56] References Cited

U.S. PATENT DOCUMENTS

| | | | |
|---|---|---|---|
| 4,324,631 | 4/1982 | Meckel et al. | 204/192.2 |
| 4,620,872 | 11/1986 | Hijikata et al. | 75/246 |
| 4,994,320 | 2/1991 | Jagielinski | 204/192.2 |
| 5,421,915 | 6/1995 | Nakanishi et al. | 148/304 |

FOREIGN PATENT DOCUMENTS

| | | | |
|---|---|---|---|
| 2-290004 | 11/1990 | Japan | 204/192.2 |
| 4-65102 | 3/1992 | Japan | 204/192.2 |
| 4-137715 | 5/1992 | Japan | 204/192.2 |
| 5-6822 | 1/1993 | Japan | 204/192.2 |
| 1184428 | 3/1970 | United Kingdom | 204/192.2 |

OTHER PUBLICATIONS

E. Schultheiss, et al., "Effects of Target Structure on the Properties of MO Recording Media Produced in a Large–Scale Vertical In–Line Sputtering System", IEEE Transactions on Magnetics, vol. 24, No. 6, (pp. 2772–2774), Nov. 1988.

T. Nate, et al., "Preparation of the Alloy Target for Magneto–Optical Recording Media", IEEE Transactions on Magnetics, vol. 24, No. 6, Nov. 1988.

*Primary Examiner*—Rodney McDonald
*Attorney, Agent, or Firm*—Oblon, Spivak, McClelland, Maier & Neustadt, P.C.

[57] ABSTRACT

A magnetron sputtering method using a sputtering target consisting of a material having a maximum relative magnetic permeability of 50 or more or consisting of a soft magnetic material which contains two or more phases selected from the group consisting of an M—X alloy phase, an M phase, and an X phase in that at least the simple substance phase consisting of an element having a smaller atomic weight of M and X is included, with the proviso that M≠X, M is at least one element selected from the group consisting of Fe, Co and Ni, and X is at least one element selected from the group consisting of Fe, Al, Si, Ta, Zr, Nb, Hf and Ti.

15 Claims, 4 Drawing Sheets

- ▨ Fe$_{90}$Zr$_{10}$ PHASE
- ▦ Zr PHASE
- ☐ Fe PHASE

MAGNETRON SPUTTERING METHOD AND SPUTTERING TARGET

BACKGROUND OF THE INVENTION

1. Field of the Invention

The present invention relates to a magnetron sputtering method for forming a soft magnetic thin film serving as a constituent of a magnetic recording head. The present invention also relates to a sputtering target for use in the magnetron sputtering method.

2. Description of the Related Art

Recently, to increase the density of magnetic recording, gaps and tracks of a magnetic head have been made narrower and recording media having a greater coercive force have been developed. As material suitable for such a magnetic head, soft magnetic thin films having high saturation magnetic flux density as well as high magnetic permeability have been developed and some of them have been already put in practical use. As magnetic heads formed of the soft magnetic thin film, there are known an MIG head and a laminated head used for recording and reproducing to a tape medium in a VTR, and a thin-film head used for recording and reproducing to a disk media in a hard disk drive.

Hitherto dominantly used soft magnetic thin films in these heads are NiFe films. Further, use may be made of FeAlSi films, Co-based amorphous films represented by a CoZrNb film and Fe nitride-based microcrystalline films represented by FeTaN and FeZrN films that are suitable for high-density recording. Some of them have been already put in practical use, and others are now in developing. Furthermore, in future, CoFe-based soft magnetic thin films are expected to be utilized. Hitherto, these soft magnetic thin films have been formed by a sputtering method, particularly, a magnetron sputtering method using an alloy target having substantially the same composition as that of a desired thin film.

The sputtering method is preferably used to form the soft magnetic thin film. This is because a CVD method is not suitable for industrial use since the raw material gas for forming a magnetic thin film in a CVD method is hardly or cannot be obtained and, even if obtained, it is highly toxic. The sputtering method is advantageous compared to other PVD methods such as a vapor deposition because magnetic properties of the soft magnetic thin film can be controlled well by the sputtering method. Of various sputtering methods available, the magnetron sputtering method is the most preferable. Unlike other sputtering methods, it can achieve industrially advantageous features such as a high deposition rate and a wide range of selectivity of materials due to less heat load given to a substrate.

However, when the magnetron sputtering method is applied to form a soft magnetic thin film for a magnetic head, it is necessary to satisfy the following technical requirements. That is, not only a high saturation magnetic flux density and high magnetic permeability should be imparted to the soft magnetic thin film for a magnetic recording head, but in-plane magnetic isotropy is required for a laminate head and appropriate in-plane magnetic anisotropy for an HDD head. Although it is possible to control the in-plane magnetic anisotropy of the soft magnetic thin film in the magnetic field during a postdeposition anneal, the in-plane magnetic anisotropy should be better to be controlled during the growth of the film from an industrial point of view. For example, in order to prevent in-plane magnetic anisotropy of an Fe nitride-based microcrystalline film for a laminated head which requires in-plane magnetic isotropy, the film is formed on a stationary substrate disposed right over a target that is subjected to sputtering erosion. This is because if a substrate is placed obliquely to the erosion portion, the microcrystalline structure of a film is also tilted to the substrate surface, with the result that undesirable in-plane magnetic anisotropy is unexpectedly generated. The in-plane magnetic anisotropy may be prevented by moving a substrate relative to a target. However, a complicated procedure is required to move the substrate. This is why this method has not yet been carried out successfully.

When the soft magnetic thin film is formed by the sputtering method, particularly, the magnetron sputtering method, under the condition that the substrate position is restricted as mentioned above, it has been found that as a target is eroded or becomes thinner, the composition of the soft magnetic thin film varies drastically. Hence, in order to form a soft magnetic thin film at a desired composition, the thickness of a target capable of sputtering may be limited to a significantly thin range. In the consequence, to make a desired film having sufficient thickness, a number of targets must be used, which inevitably increases the target cost. In addition, more time is required for exchanging a number of targets and for conditioning to remove a degraded surface phase and to stabilize the surface composition of a new target to be exchanged for. As the manufacturing time increases, a manufacturing cost raises resulting in an increase in a magnetic head price. This is a considerable problem from an industrial point of view.

SUMMARY OF THE INVENTION

The present invention has been made to solve the aforementioned problems. Therefore, an object of the present invention is to provide a magnetron sputtering method capable of preventing a change in composition of a soft magnetic thin film during the course of target erosion and capable of improving the productivity thereof. Another object of the present invention is to provide a sputtering target for use in this magnetron sputtering method.

According to the present invention, there is provided a magnetron sputtering method in which a substrate is disposed opposite to the upper surface of a sputtering target, a magnetic field is applied to the target from a magnetic field source disposed on the rear surface of the target to generate magnetron discharge over the upper surface of the target, and sputtering of the target is preformed thereby forming a magnetic thin film on the substrate, wherein the sputtering target consists of a material having a maximum relative magnetic permeability of about 50 or more or formed of a soft magnetic material which contains two or more phases selected from the group consisting of an M—X alloy phase, an M simple substance phase and an X simple substance phase in that at least the simple substance phase consisting of an element having a smaller atomic weight of M and X is included, with the proviso that M≠X; M is at least one element selected from the group consisting of Fe, Co and Ni; and X is at least one element selected from the group consisting of Fe, Al, Si, Ta, Zr, Nb, Hf and Ti.

According to the present invention, there is provided a sputtering target consisting of a material having a maximum relative magnetic permeability of about 50 or more or formed of a soft magnetic material which contains two or more phases selected from the group consisting of an M—X alloy phase, an M simple substance phase and an X simple substance phase in that at least the simple substance phase consisting of an element having a smaller atomic weight selected form the group consisting of M and X is included, with the proviso that M≠X; M is at least one element selected from the group consisting of Fe, Co and Ni; and X is at least one element selected from the group consisting of Fe, Al, Si, Ta, Zr, Nb, Hf and Ti.

DETAILED DESCRIPTION OF THE PREFERRED EMBODIMENTS

Hereinbelow, the present invention will be explained in detail.

The present invention is directed to a magnetron sputtering method and a sputtering target for use in forming a magnetic thin film represented by M—X. The magnetic thin film formed by the present invention is not particularly restricted. However, the present invention is particularly advantageous in forming a soft magnetic thin film having high magnetic permeability and high saturation magnetic flux density. Examples of such a soft magnetic thin film include NiFe films, FeAlSi films, Co-based amorphous alloy films represented by CoZrNb and CoPt films, Fe nitride-based microcrystal-line films (Fe—X—N, wherein N is nitrogen) represented by FeTaN, FeZrN and FeNbN films, a CoFe film, and the like.

The constituents M and X of the sputtering target of the present invention are, as a matter of course, selected so as to correspond to the constituents of a desired magnetic thin film. If a nitride-based magnetic thin film is desired, a target consisting of constituents M and X may be sputtered in an atmosphere containing nitrogen.

The magnetron sputtering is usually performed as follows: A substrate is disposed opposite to a target in a sputtering chamber. On the rear surface of the target, a magnet is disposed for supplying the magnetic field which provides magnetron discharge. Then, magnetron discharge is allowed to generate over the upper surface of the target, thereby performing sputtering. In this way, a magnetic thin film is formed on the stationary substrate.

The present inventors elucidated the causes why the M/X ratio of a thin film formed on a substrate varies as a target is eroded in the magnetron sputtering method. Based on the results, the present invention is made. The causes will be explained hereinbelow.

It is generally known that when sputtering is performed to a surface of alloy target formed of at least two elements different in atomic weight, distribution of ejection angles of atoms from the target surface is different depending on the element species. More specifically, the ejection angles of atoms having relatively smaller mass tend to distribute with more inclined toward the direction perpendicular to the target surface than those of atoms having relatively larger mass. This tendency becomes remarkably with a decrease in the energies of incident sputtering ions upon the alloy target. The energies of incident ions on the target are determined mainly by a cathode fall voltage (direct current self bias voltage: $V_{DC}$) generated in close to the target surface. These mechanisms are disclosed in, for example, J. Appl. Phys. 50 (5), 1979, pp 3677–3683.

If the atomic weight of M is smaller than that of X contained in an M—X alloy target, the ejection angles of M atoms from the target may tend to distribute with more inclined toward the direction perpendicular to the target surface than those of X atoms. The inclination of the angle distribution is observed more remarkably as $V_{DC}$ is smaller.

Furthermore, as an M—X alloy target gradually becomes thinner with erosion of the target, the amount of magnetic flux penetrating through the target from the magnet disposed onto the rear surface thereof gradually increases, since the target has high permeability. As a result, the magnetic field strength for generating magnetron discharge increases. Due to this, under the condition in which constant power is supplied to generate magnetron discharge, the magnetron movement of discharged electrons becomes noticeable, increasing plasma density, with the result that $V_{DC}$ decreases. Hence, as a target is eroded more and more, the ejection angles of M atoms having smaller atomic weight from the M—X alloy distribute gradually close to the direction perpendicular to a target. Consequently, the M/X ratio of the magnetic thin film formed on the substrate right over the target gradually increases. This phenomenon is clearly observed in the case where use is made of a sputtering target having a maximum relative magnetic permeability of at least 50, particularly, 100 or more.

On the contrary, when element M has a larger atomic weight than element X, the M/X ratio of the magnetic thin film gradually decreases with a target erosion. In either case, the total number of the sputtered atoms diminishes as energies of sputtering ions decreases. As mentioned above, the present inventors elucidated the mechanisms why the composition of a magnetic thin film changes with a target erosion in the case of using a conventional alloy target.

As is apparent from the above discussion, the present invention is not concerned with a target material having a relatively low magnetic permeability even if the target is a magnetic material. For example, a target practically used for forming a rare earth-transition metal alloy thin film, such as a TbFeCo film used in a magnetooptical recording medium, has a maximum relative magnetic permeability as low as 20.

In such a target having low maximum magnetic permeability, the amount of leakage magnetic flux toward the upper surface of the target does not increase as a target is eroded. Thus, even if a target made of an alloy phase alone is used, a change in the film composition during the course of target erosion can be negligible. As a target for use in forming a TbFeCo thin film, there is known one having an alloy phase and a simple substance phase as is the case with the present invention. However, this target is directed to make in-plane composition distribution uniformly but not concerned with a change in composition of the magnetic film with target erosion. Therefore, this target substantially differs from that of the present invention.

On the other hand, as to sputtering of a simple substance target, the total number of sputtered atoms consisting of simple substance diminishes as well as the ejection angles of sputtered atoms tend to distribute close to the direction parallel to the target surface with a decrease in sputtering ion energies (reported in J. Appl. Phys. 31 (1), 1960, pp. 177–179).

As described above, as a target is gradually eroded, the ejection angles of atoms having a smaller atomic weight of either element M or X from an M—X alloy target tend to distribute in the direction opposite to those of atoms from a simple substance target consisting of element M or X.

The present invention is basically made by taking advantages of this phenomenon positively. The present invention makes it possible to maintain the composition of a magnetic thin film formed on a substrate constantly, even if target erosion is further advanced, by compensating changes in ejection angle distribution of M or X atoms from an M—X alloy phase and a simple substance phase with each other.

In the present invention, a simple substance phase having a smaller atomic weight selected from the group consisting of M and X must be included in the aforementioned two or more phases of the target. It is particularly preferable that the target contains an M—X alloy phase and a simple substance phase of a smaller atomic weight selected from the group consisting of the M and X. Furthermore, the target of the present invention may contain three phases, namely, an M—X alloy phase, M simple substance phase and X simple substance phase. In particular, when use is made of a sputtering target formed of at least two phases selected from the group consisting of an Fe—X alloy phase, Fe simple substance phase and X simple substance phase wherein X is an element selected from the group consisting of Zr, Ta, Nb, Hf and Ti, good results can be obtained.

The target used in the present invention may be formed of phases consisting of crystal grains. Alternatively, the target may be formed of mosaic phases. The target formed of phases consisting of crystal grains can be prepared by sintering a mixture of raw material powders forming individual phases by vacuum hot pressing. The mosaic target can be prepared by cutting individual phases into pieces appropriately and combining them together.

In the present invention, the alloy phase refers, for example, to a phase formed of intermetallic compounds, that is, a phase in which different elements are contact with each other at an atomic level. The mutual contact between different elements is also observed in the boundary of an alloy phase and a simple substance phase of a target. If the sizes of individual phases are set appropriately, the ejection of atoms will be scarcely influenced by collision or interaction between different atoms near the boundary. The appropriate size of each phase is at least about 10 $\mu$m.

The upper limit of the size of each phase is not particularly restricted. For Example, a mosaic target may be formed by combining several-centimeter blocks. However, to form an uniform magnetic thin film by using a target consisting of crystal grains, it is preferred that the size of the crystal grains forming each phase be sufficiently smaller than that of a sputter-eroded portion of a target. The size of the sputter-eroded portion is usually in several centimeter order. Hence, if the size of a crystal grain is less than $\frac{1}{10}$ of that of the sputter-eroded portion, that is, 1 mm or less, substantially uniform magnetic thin film may be obtained.

If the sputtering target of the present invention is used in the magnetron sputtering method, the composition of the magnetic thin film formed on a substrate can be maintained uniformly even if erosion is advanced. Hence, a microcrystalline soft magnetic thin film having predetermined magnetic properties suitable for a magnetic head can be constantly provided. This advantage of the present invention will probably have effects on economy such as improvement in productivity and cost down of a magnetic head. The method of the present invention is particularly effective in forming an Fe nitride-based micro-crystalline film that is required to have in-plane magnetic isotropy.

Figure 1:
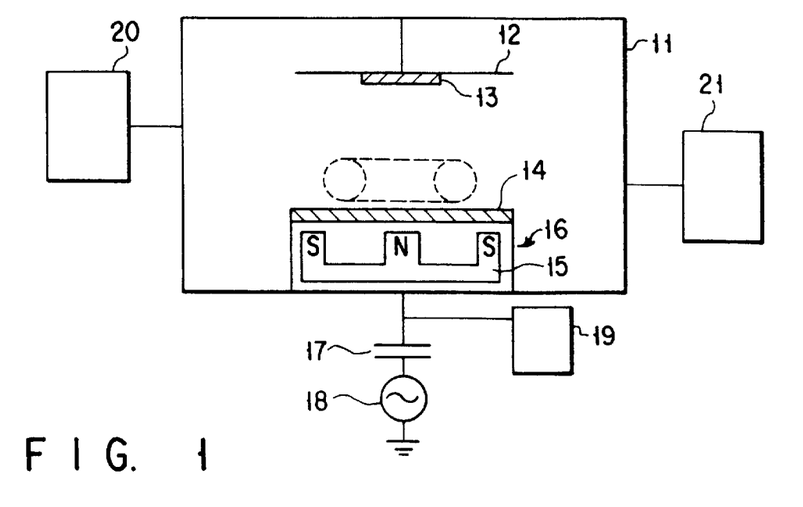
FIG. 1 is a view showing the structure of a magnetron sputtering apparatus used in the Examples of the present invention.

Referring now to FIG. 1, a magnetron sputtering apparatus used in the present invention will be explained. In FIG. 1, in a sputtering chamber 11, a holder 12 is placed. On the holder 12, a substrate 13 is mounted. Also, in the sputtering chamber 11, there is provided a sputtering source 16 consisting of a target 14 and a concentric-type permanent magnet 15 for magnetron discharge disposed on the rear surface of the target 14. The target 14 is connected to a radio frequency power supply 18 via a direct current cut-off capacitance 17. The cathode fall voltage (direct current self bias voltage $V_{DC}$) applied to the target 14 is monitored by a detector 19. The sputter chamber 11 is evacuated by an evacuation system 20 and a sputtering gas is introduced into the chamber 11 from the gas introducing system 21. Above the target 14, toroidal magnetron plasma is generated. A portion of the target 14 corresponding to the inner side of the magnetron plasma is eroded. The substrate 13 is fixed on the holder 12 right over the eroded portion of the target 14.

To obtain data necessary for designing the sputtering target of the present invention for forming an FeZrN soft magnetic thin film, the following basic experiments were performed in the aforementioned apparatus, by using an $Fe_{90}Zr_{10}$ (at %) alloy target (as a conventional target), an Fe target and a Zr target, independently. In the FeZrN soft magnetic thin film, if an Fe/Zr ratio of the film falls within the range of 10.8±1, preferable 10.8±0.5, good magnetic properties will be imparted. In the prior art, an $Fe_{90}Zr_{10}$ alloy target has been used having an Fe/Zr ratio close to that of a desired soft magnetic thin film. In all cases, a target size was 5 inch in diameter and the thickness was 2.5 mm in case of an $Fe_{90}Zr_{10}$ target, 1 mm in case of an Fe target, and 5 mm in case of a Zr target.

After a glass substrate for a film analysis was set onto the holder 12, the sputtering chamber was closed, followed by evacuating to a pressure of $10^{-6}$ Torr or less. Subsequently, a 10% $N_2$—Ar mixed gas was introduced into the sputtering chamber at a flow rate of 100 sccm by operating a gas introducing system 21, thereby maintaining the pressure of the sputtering chamber at $5 \times 10^{-3}$ Torr. Thereafter, RF power of 800 W was applied to the target by operating the power supply, thereby generating magnetron plasma over the upper surface of the target opposing to the substrate. Sputtering was performed continuously for one hour without moving the substrate over the target. In this manner, a thin film was formed by using the target as a raw material. In the above experiment, thin films were formed by varying $V_{DC}$ with respect to each target. The most practical way to vary $V_{DC}$ is eroding a target. However, another method principally equivalent to the target erosion was employed in these experiments for varying $V_{DC}$. That is, $V_{DC}$ was varied by adjusting the distance between the target and the permanent magnet. The thin films formed in the aforementioned manner were then subjected to an ICP emission spectrum analysis to determine elements contained in the films.

Figure 2:
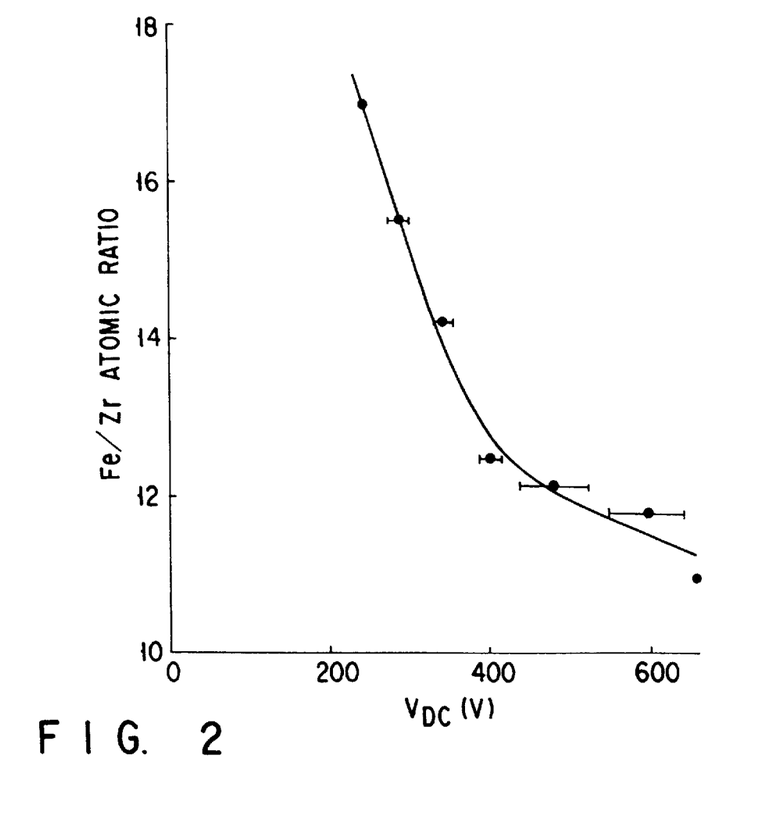
FIG. 2 is a graph showing the relationship between a cathode fall voltage ($V_{DC}$) and an Fe/Zr ratio of a soft magnetic thin film formed by using a conventional $Fe_{90}Zr_{10}$ alloy sputtering target.

FIG. 2 shows the relationship between $V_{DC}$ and an Fe/Zr atomic ratio of the FeZrN soft magnetic thin film formed by using the conventional $Fe_{90}Zr_{10}$ alloy target. As is apparent from FIG. 2, in the FeZrN thin film formed by using the conventional target, the Fe/Zr ratio of the thin film sharply increases with a decrease in $V_{DC}$ (corresponding to a target erosion). Although a desirable Fe/Zr ratio is 10.8±1, preferably 10.8±0.5, the sharp increase occurs in the Fe/Zr ratio of the FeZrN soft magnetic thin film as shown in FIG. 2. Therefore, to obtain a preferable Fe/Zr ratio of the soft magnetic thin film, the thickness of the target capable of sputtering must be limited to significantly thin range. In the consequence, to make a desired film having sufficient thickness, a number of targets must be used by frequently exchanging them. However, the price of a target is mainly determined by a cost required for target processing rather than by a raw material cost. Accordingly, the target cost is not reduced so much even if a target is thin. Conversely, a cost for exchanging targets is additionally required, leading to an increase in the entire process cost.

Figure 3:
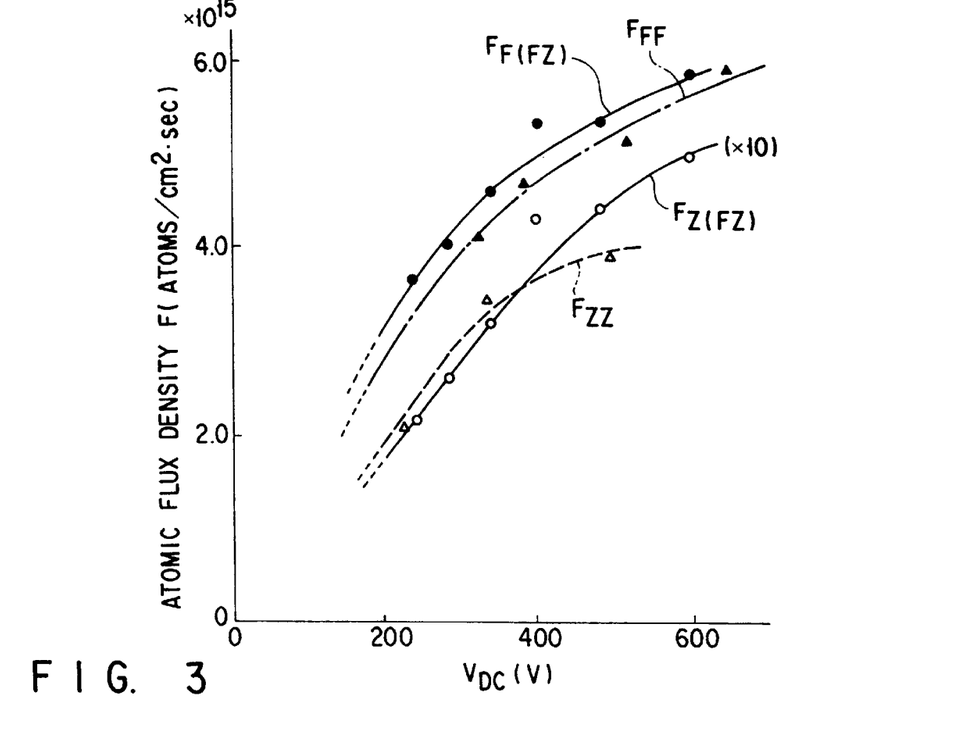
FIG. 3 is a graph showing the relationship between $V_{DC}$ and incident atomic flux density of each element on a substrate when a thin film is formed on a substrate by using an $Fe_{90}Zr_{10}$ alloy target, an Fe simple substance phase target and a Zr simple substance phase target.

FIG. 3 shows the relationship between $V_{DC}$ and the atomic flux densities of individual elements injected into a substrate, obtained from the aforementioned basic experiments. In FIG. 3, a solid circle ($F_{F(FZ)}$) represents the atomic flux density of Fe atoms ejected from an FeZr target and arriving at a substrate; an open circle ($F_{Z(FZ)}$) represents the atomic flux density of Zr atoms ejected from an FeZr target and arriving at a substrate; a solid triangle ($F_{FF}$) represents the atomic flux density of Fe atoms ejected from an Fe target and arriving at a substrate; and an open triangle ($F_{ZZ}$) represents the atomic flux density of Zr atoms ejected from a Zr target and arriving at a substrate.

On the basis of the aforementioned basic experiments, the sputtering target of the present invention was designed. First, we will explain a case of forming a desired target comprising three phases, namely, $Fe_{90}Zr_{10}$ alloy phase, Fe phase and Zr phase. If the content of the $Fe_{90}Zr_{10}$ alloy phase is represented by $Y_{FZ}$, and the content of the Fe phase is represented by $Y_F$, then, the content of the Zr phase becomes $(1-Y_{FZ}-Y_F)$. Therefore, the atomic flux densities $F_F$ and $F_Z$ of Fe and Zr atoms arriving at a substrate are given by $$F_F = F_{F(FZ)}Y_{FZ} + F_{FF}Y_F$$

$$F_Z = F_{Z(FZ)}Y_{FZ} + F_{ZZ}(1-Y_{FZ}-Y_F).$$

From these equations, if values of $Y_{FZ}$ and $Y_F$ are obtained so as to give a minimum $\Delta(F_F/F_Z)/\Delta V_{DC}$ value which means that change in ratio of $F_F/F_Z$ is the smallest relative to a change in $V_{DC}$ and to give a ratio of $F_F/F_Z$ corresponding to a predetermined Fe/Zr ratio, then, it is possible to design a desired target having three-phase mixed structure. Each curve shown in FIG. 3 is fitted an appropriate function in terms of variable $V_{DC}$. The functions obtained are substituted in the above equations to obtain $Y_{FZ}$ and $Y_F$. An example of the solutions is 29 area % of $Fe_{90}Zr_{10}$ alloy phase, 63 area % of Fe phase and 8 area % of Zr phase.

Figure 4:
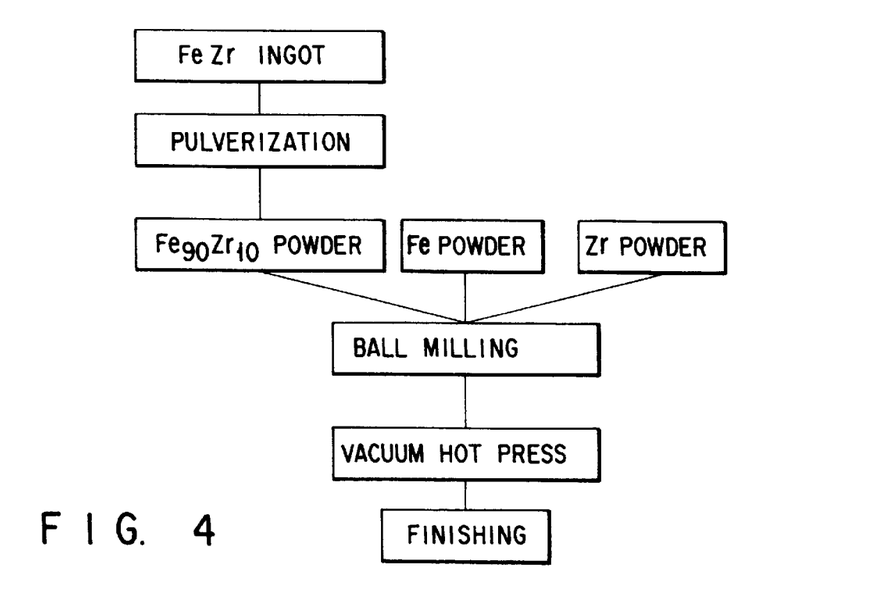
FIG. 4 is a flow-chart showing manufacturing steps of the sputtering target of a three-phase mixed structure according to the present invention.

Based on the data for designing a target obtained above, a target was formed in practice according to the target manufacturing steps of the flow chart shown in FIG. 4. First, an $Fe_{90}Zr_{10}$ alloy ingot was prepared by radio frequency melting in vacuum. The resultant ingot was pulverized by a rotation electrode method into an $Fe_{90}Zr_{10}$ powder having 100 to 300 $\mu$m in diameter. Besides this, an Fe powder of 5 to 100 $\mu$m in diameter and a Zr powder of 100 to 300 $\mu$m in diameter were prepared. These powders were blended in the ratio shown in Table 1 and mixed by ball milling for 72 hours. To prevent oxidation, the mixing was performed in vacuum. The mixed powder was molded and sintered at 1200° C. for 2 hours under a pressure 250 kg/cm² by vacuum hot pressing. The resultant article was subjected to a finishing treatment, thereby obtaining the sputtering target of the present invention.

TABLE 1

|  | Particle Diameter ($\mu$m) | Component Ratio (mol %) | Component Ratio (wt %) |
| --- | --- | --- | --- |
| $Fe_{90}Zr_{10}$ | 100–300 | 28.1 | 28.57 |
| Fe | 5–100 | 62.7 | 58.48 |
| Zr | 100–300 | 8.5 | 12.95 |

Figure 5:
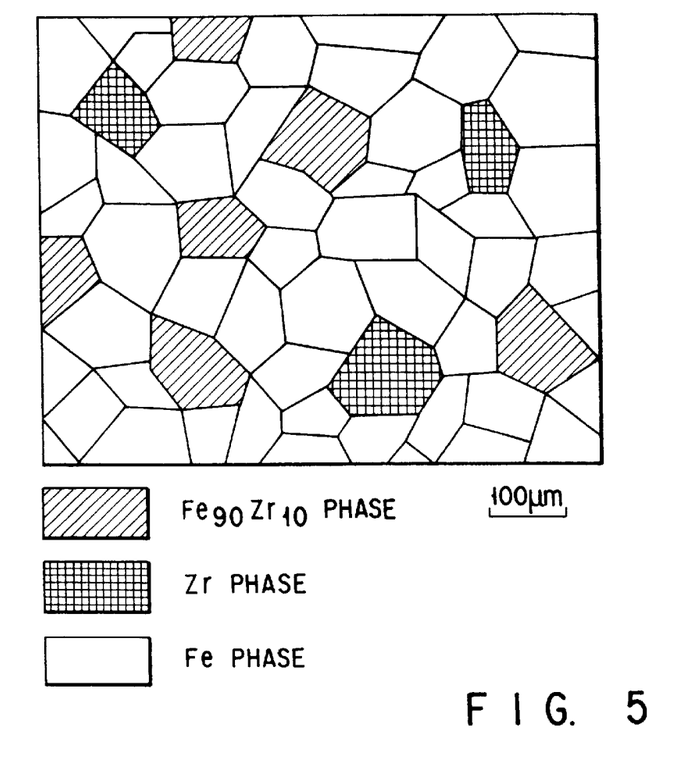
FIG. 5 is a schematic illustration of metallographic structure of the surface of a sputtering target of a three-phase mixed structure according to the present invention.

In FIG. 5, the metallographic structure of the surface of the target thus obtained is illustratively shown. Individual crystal grains were slightly diffused to each other at a level of 1 to 5 $\mu$m at their boundaries but maintained approximately the same size and composition as that of raw material powder. The maximum relative magnetic permeability of the target was about 1500.

In the aforementioned manufacturing steps, $ZrH_2$ may be used instead of Zr. Since $ZrH_2$ is decomposed during the hot pressing, the same target as above can be obtained. Furthermore, $ZrH_2$ is advantageous in providing a target containing less oxygen. The hot pressing is preferably used since it can provide a high density target effective for preventing abnormal discharge and dust generation taken place during the sputtering step. However, other methods such as normal-pressure sintering and HIP may be used as long as they can provide a target having a density which is 90% or more of a theoretical density.

Figure 6:
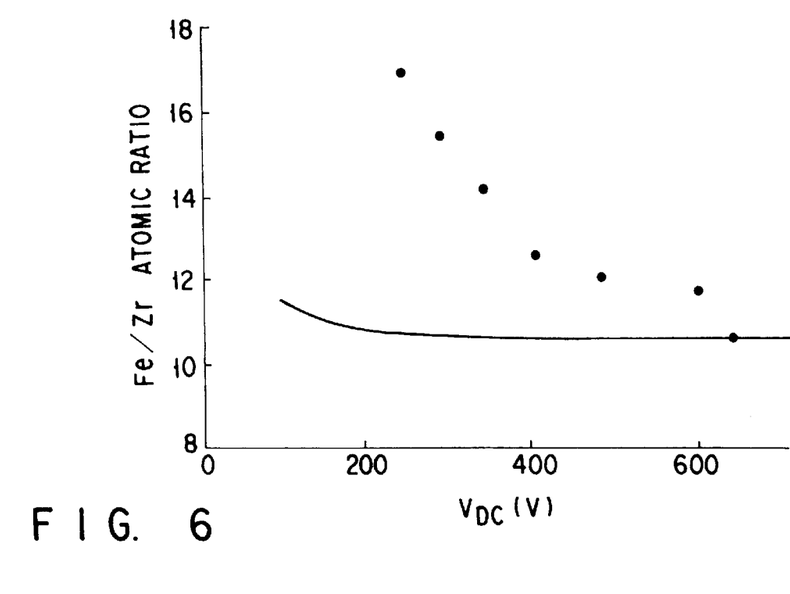
FIG. 6 is a graph showing the relationship between a cathode fall voltage ($V_{DC}$) and an Fe/Zr ratio of a soft magnetic thin film formed by using the sputtering target of a three-phase mixed structure shown in Examples of the present invention.

Furthermore, an FeZrN soft magnetic thin film was formed on a substrate by magnetron sputtering in an atmosphere containing nitrogen, using the sputtering target thus obtained. The Fe/Zr ratio of the film thus formed is indicated by a solid line in FIG. 6. For comparison, the Fe/Zr ratio of the soft magnetic thin film formed by using a conventional $Fe_{90}Zr_{10}$ alloy target in the same conditions as above is also plotted in FIG. 6. As is apparent from FIG. 6, in the case of a target comprising three-phase mixed structure of the present invention, even if $V_{DC}$ decreases from 700 V to 150 V, the Fe/Zr ratios of the soft magnetic thin film formed on a substrate falls within the range of 10.8±0.2. This implies that if a target of 5 mm thick is completely consumed, a film having a predetermined composition can be formed. Since a target price is not much dependent upon the thickness thereof, the price of a target can be substantially reduced to a large extent. Moreover, a process cost can be drastically reduced by shortening time required for exchanging targets and for conditioning targets.

In the above example, $Fe_{90}Zr_{10}$ (at %) was employed as an FeZr alloy. However, if the data corresponding to those shown in FIG. 3 are obtained, it is possible to design another sputtering target having an FeZr alloy phase of a different Fe/Zr ratio. The composition of a mixed phase target used in forming a thin film represented by M—X can be expressed by $$Y_{MX}(M_xX_{1-x}) + Y_MM + (1 - Y_M - Y_{MX})X \quad (1)$$

where, $Y_{MX}$, $Y_M$, and $(1-Y_M-Y_{MX})$ are ratios of, an MX alloy phase, M phase and X phase, respectively, and x is a ratio of element M of the MX alloy phase. In this case, ratio of phases constituting a target to be designed, i.e., the ratio capable of canceling the dependency of film composition on $V_{DC}$, can be obtained by determining a set of values of $Y_{MX}$, $Y_M$, $(1-Y_M-Y_{MX})$ and x giving a minimum $\Delta(F_M/F_X)/\Delta V_{DC}$ value, that is the differential coefficient of the atomic flux density ratio of M and X atoms arriving at a substrate relative to $V_{DC}$, when the target is sputtered.

Figure 7A:
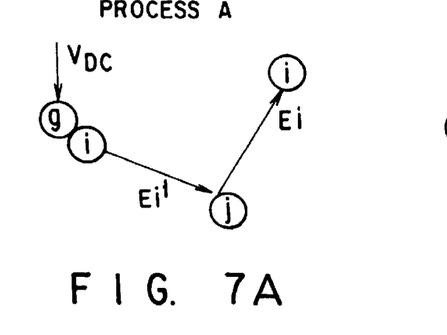
FIG. 7 represents illustrations for explaining ejection processes by sputtering through binary collision.
Figure 7B:
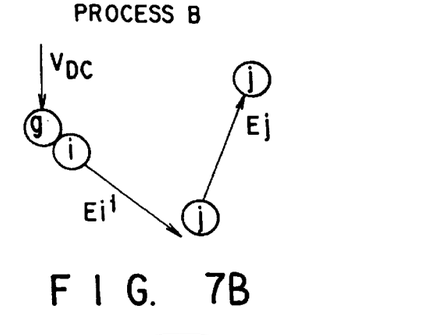

FIG. 7 shows two sputtering processes A and B in which atoms are ejected by sputtering through binary collision. In process A, when sputtering-gas ion g+ (represented by Ar) hits atom i, atom i is scattered toward deep in the target to collide with atom j, and then the atom i is repulsed by atom j and ejected. The probability of ejection of atom i by sputtering is defined as $A_{ijj}$. In process B, atom i collides with atom j, and then atom j is scattered and ejected. The probability of ejection of atom j by sputtering is defined as $B_{ijj}$. If the probabilities, $A_{ijj}$ and $B_{ijj}$ are expressed in terms of M and X, 8 types of expressions are possible, as shown in Table 2, since atom i may be M or X, similarly, atom j may be M or X.

TABLE 2

| Process A | | | | Process B | | | |
|---|---|---|---|---|---|---|---|
| i | j | i | | i | j | j | |
| M | M | M | $A_{MMM}$ | M | M | M | $B_{MMM}$ |
| M | X | M | $A_{MXM}$ | M | X | M | $B_{MXX}$ |
| X | M | X | $A_{XMX}$ | X | M | X | $B_{XMM}$ |
| X | X | X | $A_{XXX}$ | X | X | X | $B_{XXX}$ |

Therefore, atomic flux densities $F_M$ and $F_X$ of M and X arriving at a substrate are given by $$F_M = Y_{MX}[x^2(A_{MMM}+B_{MMM}) + x(1-x)A_{MXM} + (1-x) \times B_{XMM}] + Y_M(A_{MMM}+B_{MMM}) \quad (2)$$

$$F_x = Y_{MX}[(1-x)^2(A_{XXX}+B_{XXX}) + (1-x) \times A_{XMX} + x(1-x)B_{MXX}] + (1-Y_{MX}-Y_M)(A_{XXX}+B_{XXX}) \quad (3)$$

If a model of collision between rigid spheres is applied, we get $A_{MMM} = B_{MMM}$ and $A_{XXX} = B_{XXX}$.

The ratio of ejection probability of process A to that of process B are expressed by $\eta_{MX} = A_{MXM}/B_{MXX}$, and $\eta_{XM} = A_{XMX}/B_{XMM}$.

Now, assuming that M=Fe, X=Zr, a model of collision between rigid spheres is applied to the Fe—Zr system, in consideration of the law of conservation of energy and the law of conservation of momentum, then we get $\eta_{FZ}=3.51$ and $\eta_{ZF}=0.98$.

That is, the probability of Fe ejection from a target through the process in which Fe is scattered by Ar, collides with Zr and is repulsed out by Zr is 3.5 times larger than the probability of Zr ejection through the process in which Fe is scattered by Ar and pushes Zr out. On the other hand, the probability of Zr ejection from a target through the process in which Zr is scattered by Ar, collides with Fe and is repulsed out by Fe is nearly equal to the probability of Fe ejection through a process in which Zr is scattered by Ar and pushes Fe out. As described before, a main cause why a film composition is drastically changed by $V_{DC}$ is that $\eta_{FZ}$ deviates from unity. From the discussion above, equations (2) and (3) can be simplified into equations (4) and (5), respectively:

$$F_M = Y_{MX}[2x^2 A_{MMM} + x(1-x)\eta_{MX} B_{MMM} + (1-x) \times B_{XMM}] + 2Y_M A_{MMM} \quad (4)$$

$$= Y_{MX}[2x^2 A_{MMM} + 3.51 \cdot x(1-x)B_{MXX} + (1-x) \times B_{XMM}] + 2Y_M A_{MMM}$$

$$F_X = Y_{MX}[2(1-x)^2 A_{XXX} + (1-x)x\eta_{XM} B_{MXX} + 2(1-Y_{MX}-Y_M)A_{XXX} \quad (5)$$

$$= Y_{MX}[2(1-x)^2 A_{XXX} + 0.98 \cdot (1-x)xB_{MXX} + 2(1-Y_{MX}-Y_M)A_{XXX}$$

As is apparent from the comparison of these equations, unknown quantities present in the number of 8 in equations (2) and (3) decreases to 4 in the equations (4) and (5). Therefore, 4 unknown quantities, $A_{MMM}$, $B_{MXX}$, $B_{XMM}$ and $A_{XXX}$ will be calculated if 4 data, as shown in FIG. 3, are given regarding the $V_{DC}$ dependency of atomic flux densities of M and X ejected from a target having arbitrary composition. Furthermore, if two conditions: $F_M/F_X=F_F/F_Z=10.8$ and the value of $\Delta(F_M/F_X)/\Delta V_{DC}$ is minimum, are applied to equations (4) and (5), then a plurality combinations of $Y_{MX}$, $Y_M$, and x can be obtained.

The procedure mentioned above can be applied to design a target of a two phase mixed structure as well as a target of a three phase mixed structure comprising an FeZr alloy phase, Fe phase and Zr phase. In the case of M=Fe and X=Zr, it is preferred that a target be formed of an FeZr alloy phase and an Fe phase, since Fe is smaller than Zr in atomic weight. In addition, as a Zr phase is liable to diffuse, the target consisting of an FeZr alloy and an Fe phase is advantageous in a view point of manufacturing.

An example of the values of x, $Y_{FZ}$ and $Y_F$, obtained under the condition $Y_{MX}+Y_M=1$ (no Zr phase) in this case, are 78 at %, 23.4 area %, and 76.6 area %, respectively. That is, it is preferable that the ratio of an $Fe_{78}Zr_{22}$ (at %) alloy phase relative to an Fe phase be approximately 23.4/76.6 (area %). It should be noted that an acceptable margin is about ±10% with respect to x, $Y_{FZ}$ and $Y_F$ in the case of $F_F/F_Z=10.8\pm1.0$.

In the same manner as above, other optimum ratio can be determined. For example, when use is made of a sputtering target consisting of an $Fe_{75}Zr_{25}$ alloy phase and an Fe phase at a ratio of 47/53 (area %), the Fe/Zr ratio of a soft magnetic thin film formed will fall within the range of 10.0±0.3 even though $V_{DC}$ drops from 700 V to 150 V.

A two-phase mixed target consisting of an Fe phase and a Zr phase can be also designed. For example, if use is made of a sputtering target consisting of an Fe phase and a Zr phase approximately at a ratio of 88/12 (area %), the Fe/Zr ratio of a soft magnetic thin film formed will fall within the range of 9.8±0.7, demonstrating that this sputtering target is more effective than a conventional sputtering target. In the two-phase mixed target consisting of an Fe phase and a Zr phase, the distributions of the ejection angles of Fe and Zr atoms from a target shift toward the direction parallel to a target surface as $V_{DC}$ decreases. However, since the change in ejection angle distribution of Fe slightly differs from that of Zr in the Fe—Zr two-phase mixed target, it is presumable that change in film composition with a change of $V_{DC}$ is slightly larger than those of targets obtained in other Examples.

From the foregoing, it is concluded that the most effective target to form an FeZrN soft magnetic thin film is a target consisting of two phases of, Fe—Zr alloy phase and Fe phase, or a target consisting of three phases of Fe—Zr alloy phase, Fe phase and Zr phase.

Figure 8:
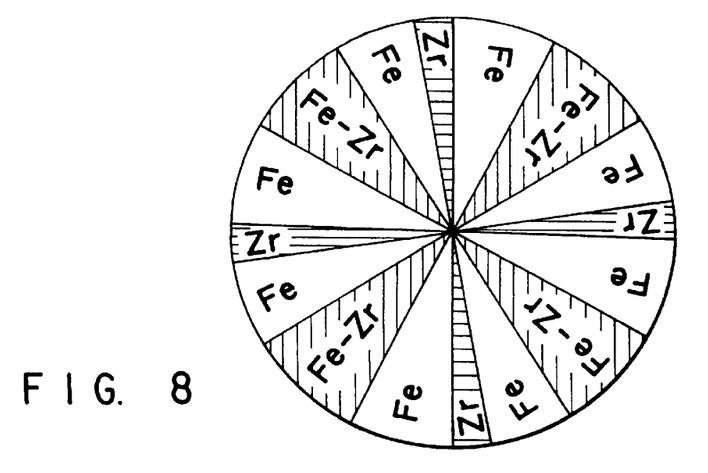
FIG. 8 is a schematic plan view of the mosaic sputtering target according to the present invention.

It is confirmed that when a mosaic target shown in FIG. 8 was used, the similar results as above were obtained. The mosaic target is formed as follows: First, disks of an $Fe_{90}Zr_{10}$ alloy phase (a mixture of intermetallic compounds), an Fe phase and a Zr phase are partially cut out in a sector form, individually. Then the sector pieces are appropriately combined and adhered one after another to form a circular mosaic target having 125 mm in diameter in such a way that the mosaic target will have the same ratio as that shown in Table 1.

In the foregoing, the formation of an Fe nitride-based microcrystalline film by using the magnetron sputtering method was explained. This magnetic film has been put in practical use as a laminated head mainly applied in DVTR and is expected for further development thereof. The present invention can be used, in general, for forming a magnetic thin film containing two or more elements for use in a magnetic head.

More specifically, a CoZrNb film was formed by using, a target consisting of a CoZrNb alloy phase and a Co phase was used; an FeSiAl film was formed by using a target consisting of an FeSiAl alloy phase, an Al phase and an Si single phase; an NiFe film was formed by using a target consisting of an NiFe alloy phase and an Fe phase; and a CoPt film was formed by using a target consisting of a CoPt alloy phase and a Pt phase. In all cases, use were made of targets having the initial thickness of about 2 mm. The values of maximum relative magnetic permeability of these targets were 1200, 1000, 800 and 300, respectively.

In all cases, at the initial stage of sputtering and at the time a target was eroded to the depth of about 1.5 mm, the magnetic thin film formed was analyzed for composition to determine a change in the composition. As a result, changes in the ratio of Co/(Zr+Nb), Fe/(Si+Al), Fe/Ni and Co/Pt were 0.2 or less. On the other hand, in the case of a conventional target consisting of an alloy phase alone, changes in the ratios of the aforementioned components were 6.5, 4.3, 2.6 and 1.8. Hence, it is demonstrated that the present invention is generally effective for a target of high magnetic permeability.

To find the range of magnetic permeability of a target effective in the present invention, we investigated the relationship between magnetic permeability and a change in a film composition. For the investigation, a plurality of targets having different in magnetic permeability for forming an FePt film were prepared according to the present invention and the prior art. The target of the present invention was formed of an FePt alloy phase and an Fe phase. The target was formed in the same designing manner as used in forming the FeZrN magnetic thin film mentioned above while the ratio of phases was being controlled so as to obtain a desired magnetic thin film having a composition close to $Fe_3Pt$ and so as to prevent a change in the film composition with target erosion. On the other hand, the conventional target was formed by sintering powders of three intermetallic compounds, $Fe_3Pt$, FePt and $FePt_3$. The magnetic permeability of the conventional target was controlled by varying a blending ratio of the powders in such a way that an average composition of the target was close to $Fe_3Pt$. The initial thickness of the targets was set at 2 mm. The maximum magnetic permeability of each of targets was determined from the magnetization curve measured by vibrating sample magnetometer (VSM), with respect to a sample piece taken from the formed target.

Figure 9:
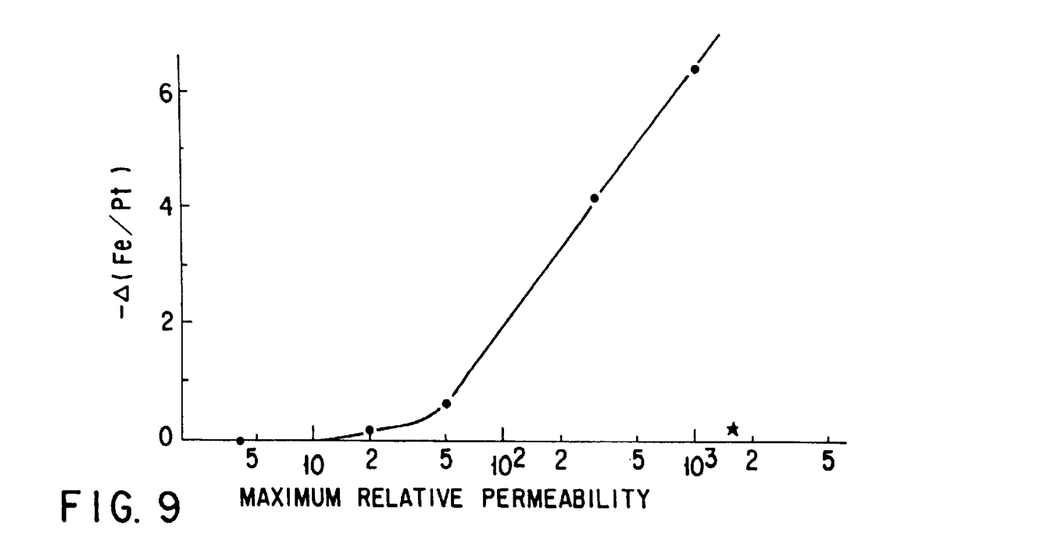
FIG. 9 is a graph showing the relationship between magnetic permeability of the targets and changes in composition of the magnetic thin films formed by using the sputtering targets of the present invention and the prior art.

Each of targets was placed in the apparatus shown in FIG. 1. At the initial stage of sputtering and at the time a target was eroded to about 1.5 mm in depth, a change in the component ratio of a magnetic thin film—Δ(Fe/Pt) was determined. The relationship between—Δ(Fe/Pt) and the magnetic permeability of a target are shown in FIG. 9. In FIG. 9, a solid circle indicates the result obtained by using the conventional targets and a solid star indicates the result obtained by using the target of the present invention.

From FIG. 9, it is found that in the case where a conventional target having a magnetic permeability of more than 50 is used, the composition of the obtained film drastically changes, as the target is eroded. In contrast, although the permeability of the target of the present invention exceeds 1000, the film composition is maintained constant even if a target is eroded. Thus, the advantage of the present invention becomes remarkably when use is made of a target having a magnetic permeability of 50 or more, preferably 100 or more.

The sputtering target of the present invention will give the most effective results when the target is used in the magnetron sputtering method. However, in sputtering methods other than the magnetron sputtering method, $V_{DC}$ may change sometimes. This is because conditions for ejection of secondary electrons from a target are varied as a result of a charge in discharge gap length or unevenness in the eroded portion of a target as a target becomes thin with target erosion. Therefore, even if the sputtering target of the present invention is used in an ion beam sputtering method, a magnetic thin film can be formed with a more constant composition.

Furthermore, the present invention is the most effective when magnetron sputtering is applied in the disposition that an substrate fixed over a target. Even in the case where a thin film is formed while a substrate is being moved relative to a sputtering target, for example, by revolution around a target, rotation on its own axis, combination of revolution and rotation, or a parallel motion to a target, the sputtering target of the present invention ensures to form a magnetic thin film with a more constant composition on a substrate, even a wide substrate, as compared to the case where a conventional sputtering target is used.

What is claimed is:

1. A magnetron sputtering method comprising:

disposing a substrate opposite an upper surface of a sputtering target;

applying a magnetic field to the sputtering target from a magnetic field source disposed on a rear surface of the sputtering target to generate magnetron discharge over the upper surface of the sputtering target; and applying a sputtering voltage to the sputtering target thereby sputtering a magnetic thin film on the substrate, wherein said sputtering target consists of a soft magnetic material having a maximum relative magnetic permeability of about 50 or more and contains an M—X alloy phase and at least one phase selected from the group consisting of an M simple substance phase and an X simple substance phase with the at least one phase selected being the simple substance phase having a smallest atomic weight relative to each simple substance phase constituent M and X where the constituent M includes at least one element selected from the group consisting of Fe, Co, and Ni and has a different atomic weight than the constituent X which includes at least one element selected from the group consisting of Fe, Al, Si, Ta, Zr, Nb, Hf, and Ti, and wherein said sputtering target is formed with at least a part of the M—X alloy phase being surrounded by the selected at least one simple substance phase.

2. The method according to claim 1, wherein said sputtering target has a maximum relative magnetic permeability of about 100 or more.

3. The method according to claim 1, wherein said sputtering target consists of three phases of an M—X alloy phase, an M simple substance phase, and an X simple substance phase.

4. The method according to claim 1, wherein crystal grains of the target are selected from the group consisting of an M—X alloy phase, an M simple substance phase and an X simple substance phase having a size of about 10 μm to about 1 mm on a sputtering surface.

5. The method according to claim 1, wherein said phases of the target are selected from the group consisting of an M—X alloy phase, an M simple substance phase and an X simple substance phase made into a mosaic form.

6. The method according to claim 1, wherein said M is Fe, said X is at least one element selected from the group consisting of Zr, Ta, Nb, Hf and Ti, and said target contains two or more phases selected from the group consisting of an Fe—X alloy phase, an Fe phase and an X phase.

7. The method according to claim 1, wherein said sputtering target is formed by mixing an M—X alloy powder with the selected at least one simple substance in powder form and sintering the mixed powders.

8. A magnetron sputtering method comprising:
disposing a substrate opposite to an upper surface of a sputtering target;
applying a magnetic field to the sputtering target from a magnetic field source disposed on a rear surface of the sputtering target to generate magnetron discharge over the upper surface of the sputtering target; and
applying a sputtering voltage to the sputtering target thereby sputtering a magnetic thin film on the substrate,
wherein said sputtering target consists of a material having a maximum relative magnetic permeability of about 50 or more and contains two phases of an M—X alloy phase and an M simple substance phase with M including at least one element selected from the group consisting of Fe, Co, and Ni and having a smaller atomic weight than X which includes at least one element selected from the group consisting of Fe, Al, Si, Ta, Zr, Nb, Hf, and Ti, and
wherein said sputtering target is formed with at least a part of the M—X alloy phase being surrounded by the M simple substance phase.

9. The method according to claim 8, wherein said sputtering target is formed by mixing an M—X alloy powder with the M simple substance in powder form and sintering the mixed powders.

10. A magnetron sputtering method comprising:
disposing a substrate opposite to an upper surface of a sputtering target;
applying a magnetic field to the sputtering target from a magnetic field source disposed on a rear surface of the sputtering target to generate magnetron discharge over the upper surface of the sputtering target;
providing an atmosphere containing nitrogen between at least the sputtering target and the substrate;
applying a sputtering voltage to the sputtering target thereby sputtering a nitride magnetic film on the substrate;
wherein said sputtering target consists of a material having a maximum relative magnetic permeability of about 50 or more and contains an M—X alloy phase and at least one phase selected from the group consisting of an M simple substance phase and an X simple substance phase with the at least one phase selected being the simple substance phase having a smallest atomic weight relative to each simple substance phase constituent M and X, where the constituent M includes at least one element selected from the group consisting of Fe, Co, and Ni and has a different atomic weight than the constituent X which includes at least one element selected from the group consisting of Fe, Al, Si, Ta, Zr, Nb, Hf, and Ti, and
wherein said sputtering target is formed with at least a part of the M—X alloy phase being surrounded by the selected at least one simple substance phase.

11. The method according to claim 10, wherein said sputtering target is formed by mixing an M—X alloy powder with the selected at least one simple substance in powder form and sintering the mixed powders.

12. A magnetron sputtering method comprising:
disposing a substrate opposite to an upper surface of a sputtering target;
applying a magnetic field to the sputtering target from a magnetic field source disposed on a rear surface of the sputtering target to generate magnetron discharge over the upper surface of the sputtering target; and
applying a sputtering voltage to the sputtering target thereby sputtering a magnetic thin film on the substrate,
wherein said sputtering target consists of a material having a maximum relative magnetic permeability of about 50 or more and contains an M—X alloy phase and at least one phase selected from the group consisting of an M simple substance phase and an X simple substance phase with the at least one phase selected being the simple substance phase having a smallest atomic weight relative to each simple substance phase constituent M and X, where the constituent M includes at least one element selected from the group consisting of Fe, Co, and Ni and has a different atomic weight than the constituent X which includes at least one element selected from the group consisting of Fe, Al, Si, Ta, Zr, Nb, Hf, and Ti,
wherein a ratio of the phases constituting said sputtering target is determined on the basis of atomic flux densities of the M constituent and the X constituent which will maintain the M/X ratio of the magnetic thin film being sputtered on the substrate constant as the sputtering target erodes, and
wherein said sputtering target is formed with at least a part of the M—X alloy phase being surrounded by the selected at least one simple substance phase.

13. The method according to claim 12, wherein said sputtering target is formed by mixing an M—X alloy powder with the selected at least one simple substance in powder form and sintering the mixed powders.

14. A magnetron sputtering method comprising:
disposing a substrate opposite to an upper surface of a sputtering target;
applying a magnetic field to the sputtering target from a magnetic field source disposed on a rear surface of the sputtering target to generate magnetron discharge over the upper surface of the sputtering target; and
applying a sputtering voltage to the sputtering target thereby sputtering a magnetic thin film on the substrate,
wherein said sputtering target consists of a soft magnetic material having a maximum relative magnetic permeability of about 50 or more and contains an M—X alloy phase, an M simple substance phase, and an X simple substance phase, and where the constituent M includes at least one element selected from the group consisting of Fe, Co, and Ni and has a different atomic weight than the constituent X which includes at least one element selected from the group consisting of Fe, Al, Si, Ta, Zr, Nb, Hf and Ti,
and wherein said sputtering target is formed with at least a part of the M—X alloy phase being surrounded by one of the M simple substance phase and the X simple substance phase.

15. The method according to claim 14, wherein said sputtering target is formed by mixing an M—X alloy powder, an M simple substance in powder form, and an X simple substance in powder form and sintering the mixed powders.

* * * * *